(12) United States Patent
Verhulst et al.

(10) Patent No.: US 9,704,992 B2
(45) Date of Patent: Jul. 11, 2017

(54) DRAIN EXTENSION REGION FOR TUNNEL FET

(71) Applicant: IMEC VZW, Leuven (BE)

(72) Inventors: Anne Verhulst, Houtvenne (BE); Devin Verreck, Pellenberg (BE); AliReza Alian, Heverlee (BE)

(73) Assignees: IMEC VZW, Leuven (BE); Katholieke Universiteit Leuven, Leuven (BE)

( * ) Notice: Subject to any disclaimer, the term of this patent is extended or adjusted under 35 U.S.C. 154(b) by 0 days.

(21) Appl. No.: 15/337,728

(22) Filed: Oct. 28, 2016

(65) Prior Publication Data

US 2017/0170314 A1    Jun. 15, 2017

(30) Foreign Application Priority Data

Dec. 21, 2015  (EP) .................................. 15201734.9

(51) Int. Cl.
*H01L 29/76* (2006.01)
*H01L 29/94* (2006.01)
(Continued)

(52) U.S. Cl.
CPC .......... *H01L 29/7835* (2013.01); *H01L 29/36* (2013.01); *H01L 29/41775* (2013.01); *H01L 29/42356* (2013.01); *H01L 29/7831* (2013.01)

(58) Field of Classification Search
CPC ............. H01L 29/7833; H01L 29/7848; H01L 29/7835; H01L 29/41775; H01L 29/7836; H01L 29/36
(Continued)

(56) References Cited

U.S. PATENT DOCUMENTS 9,041,056 B2    5/2015   Miyata et al.
9,041,104 B2    5/2015   Sugizaki et al.
(Continued)

FOREIGN PATENT DOCUMENTS

KR    2008 0006268 A    1/2008

OTHER PUBLICATIONS

Alam, et al. "A Ge Ultrathin-Body n-Channel Tunnel FET: Effects of Surface Orientation", IEEE Transactions on Electron Devices, IEEE Service Center, Piscataway, NJ, US, vol. 61, No. 11, Nov. 1, 2014, pp. 3594-3600, XP011562043.
(Continued)

*Primary Examiner* — Theresa T Doan
(74) *Attorney, Agent, or Firm* — Knobbe Martens Olson & Bear, LLP

(57) ABSTRACT

A Tunnel Field-Effect Transistor comprising a source-channel-drain structure, the source-channel-drain structure comprising a source region doped with a dopant element having a first dopant type and a first doping concentration; a drain region doped with a dopant element having a second dopant type opposite compared to the first dopant type, and a second doping concentration, a channel region situated between the source region and the drain region and having an intrinsic doping concentration, or lowly doped concentration being lower than the doping concentration of the source and drain regions, a gate stack comprising a gate electrode on a gate dielectric layer, the gate stack covering at least part of the channel region and extending at the source side up to at least an interface between the source region and the channel region, a drain extension region in the channel region or on top thereof, the drain extension region being formed from a material suitable for creating, and having a length/thickness ratio such that, in use, it creates a charged layer, in the
(Continued)

OFF-state of the TFET, with a charge opposite to the charge of the majority carriers in the drain region.

13 Claims, 4 Drawing Sheets

(51) Int. Cl.
  *H01L 29/78* (2006.01)
  *H01L 29/36* (2006.01)
  *H01L 29/417* (2006.01)
  *H01L 29/423* (2006.01)

(58) Field of Classification Search
  USPC ........................................................ 257/408
  See application file for complete search history.

(56) References Cited

U.S. PATENT DOCUMENTS

| | | |
|---|---|---|
| 9,048,267 B2 | 6/2015 | Kondo et al. |
| 2006/0046399 A1* | 3/2006 | Lindert ............... H01L 29/1054 438/282 |
| 2007/0178650 A1* | 8/2007 | Chen ..................... H01L 29/165 438/301 |
| 2013/0137236 A1 | 5/2013 | Bhuwalka et al. |
| 2015/0200289 A1 | 7/2015 | Zhang et al. |

OTHER PUBLICATIONS

Leonelli, et al. "Optimization of tunnel FETs: Impact of gate oxide thickness, implantation and annealing conditions", Solid-State Device Research Conference (ESSDERC), 2010 Proceedings of the European, IEEE, Piscataway, NJ, USA, Sep. 14, 2010, pp. 170-173, XP031787606.

Nirschl, et al. "Scaling properties of the tunneling field effect transistor (TFET): Device and circuit", Solid State Electronics, Elsevier Science Publishers, Barking, GB, vol. 50, No. 1, Jan. 1, 2006, pp. 44-51, XP027986844.

\* cited by examiner

DRAIN EXTENSION REGION FOR TUNNEL FET

INCORPORATION BY REFERENCE TO RELATED APPLICATION

Any and all priority claims identified in the Application Data Sheet, or any correction thereto, are hereby incorporated by reference under 37 CFR 1.57. This application claims the benefit of European Application No. EP 15201734.9, filed on Dec. 21, 2015. The aforementioned application is incorporated by reference herein in its entirety, and is hereby expressly made a part of this specification.

FIELD OF THE DISCLOSURE

Field Effect Transistors (FETs) based on band-to-band tunneling are provided, for use in the field of semiconductor devices.

BACKGROUND OF THE DISCLOSURE

In transistor technology, several parameters and combinations thereof play an important role in determining the applicability range and transistor speed, which have to be combined with size and semiconductor integration requirements of micro- and nanoelectronics. For example, the current that the transistor allows to flow when the transistor is in on-state (ON-current $I_{ON}$) is an important factor for applicability. Similarly, the OFF-current $I_{OFF}$ should be low in low-power applications. The difference in gate voltage which needs to be applied in order to obtain a decade of change in current flowing through the transistor as it switches from the off- to the on-state is a parameter called subthreshold swing (SS). The lower the average SS value, the faster a transistor can reach the ON-current $I_{ON}$. In traditional Metal-Oxide-Semiconductor Field-Effect Transistors (MOSFETs) at room temperature, this SS is limited to 60 mV/decade at room temperature due to the thermal energy of the carriers and the capacitance of the transistors.

On the other hand, Tunnel Field-Effect transistors use band-to-band tunneling (BTBT), a process in which electrons tunnel from the valence band through the semiconductor bandgap to the conduction band or vice versa. Transistors operating under BTBT can reach lower SS values, but often at the cost of a lower ON-current. Such Tunnel FETs (TFETs) comprise a particular doping profile and connections defining a source region, a gate, a channel and a drain region. Source and drain regions are doped regions with opposite doping types. The drain doping determines the type of TFET, so for example n-TFETs comprise drains with n-type doping. The SS value and ON-current has been improved by improving doping levels and by choosing appropriate materials. For example, IV materials as well as mixtures of III-V materials have been implemented in TFETs, but the optimization of both SS and ON-currents is challenging. An additional important factor is the OFF-current, which should be low. Gate-drain underlap and reduced drain doping, as well as using a material with wide bandgap in the drain, are used to reduce OFF-current. Unfortunately, the gate-drain underlap and the reduced drain doping concentration limit the maximum current through the TFET. The requirement of low OFF-current is in conflict with the requirement of a sufficiently high ON-current.

SUMMARY OF THE DISCLOSURE

It is an object of the embodiments to provide a transistor easy to manufacture, fast and with good current characteristics, such as a suppressed OFF current.

In a first aspect, a Tunnel Field-Effect Transistor (TFET) is provided comprising a source-channel-drain structure having an outer surface, the source-channel-drain structure comprising a source region doped with a dopant element having a first dopant type and a first doping concentration; a drain region doped with a dopant element having a second dopant type opposite compared to the first dopant type, and a second doping concentration; a channel region situated between the source region and the drain region and having an intrinsic doping concentration, or lowly doped concentration being lower than the doping concentration of the source and drain regions: a gate stack comprising a gate electrode on a gate dielectric layer, the gate stack covering at least part of the channel region and extending at the source side up to at least an interface between the source region and the channel region, a drain extension region in the channel region or on top thereof, the drain extension region being formed from a material suitable for creating, and having a length/thickness ratio such that, in use, it creates a charged layer, in the OFF-state of the TFET, with a charge opposite to the charge of the majority carriers in the drain region.

It is an advantage of the embodiments that drain-towards-gate band-to-band tunneling currents are reduced or even avoided. It is a further advantage that the gate electric field is increased above the extension region, and the OFF current and ambipolar current are reduced.

In an embodiment, the drain extension region may extend between 10 nm or less from an interface between the drain region and the channel region, up to 20 nm or more from an interface between the source region and the channel region. It is an advantage of the embodiments that tunneling, responsible for the first observable and undesirable increase in OFF current, takes place in a region with improved band bending near the gate with respect to previous prior art devices with no extension.

In a TFET according to an embodiment, the length of the drain extension region may be 5 nm or more. In an embodiment, the length of the drain extension region may be at least the same as its thickness. In an embodiment, the length of the drain extension region may be at least two times larger than its thickness. It is an advantage of the embodiments that tunneling is ensured to take place through a region with smaller band bending than in prior art devices.

In an embodiment, the thickness of the drain extension region may be 2 nm or less. This allows tunneling in the drain region, channel region and the extension region towards the gate stack to be reduced or avoided for most or all of extension region compositions.

In a TFET according to an embodiment, the drain extension region may be doped with dopant elements having the second dopant type. It is an advantage of the embodiments that fabrication may be made completely integrated in a fab. It is a further advantage that the field and band bending may be tightly controlled with small influence from interfaces. A doping concentration of the drain extension region may be at least $10^{19}$ at/cm$^3$. A small region with a high charge may be obtained.

In an embodiment, the drain extension region may comprise a metal layer. Metal deposition techniques allow a great versatility in the manufacturing of a TFET according to an embodiment.

In an embodiment, the drain extension region may be in contact with an interface between the drain region and the channel region. The exact overlap with the drain region is not critical, which makes the fabrication process easier. In an embodiment, the drain extension region may partially or totally overlap the drain region. Obtaining the drain extension region is easy and does not require any complex alignment.

In an embodiment, the drain extension region at least partially extends underneath the gate stack. It is an advantage of the embodiments that sharp bending of the energy bands is obtained inside the gate dielectric above the extension region, compared to prior art devices with no drain extension region, ensuring a high electric field in the gate.

In a TFET according to an embodiment, the gate stack may be any of a double-gate structure or a gate all around structure. The embodiments may be applied on a wide range of transistor types such as vertical TFETs or nanowire TFETs.

Particular and preferred aspects of the disclosure are set out in the accompanying independent and dependent claims. Features from the dependent claims may be combined with features of the independent claims and with features of other dependent claims as appropriate and not merely as explicitly set out in the claims.

These and other aspects of the disclosure will be apparent from and elucidated with reference to the embodiment(s) described hereinafter.

Figure 1:
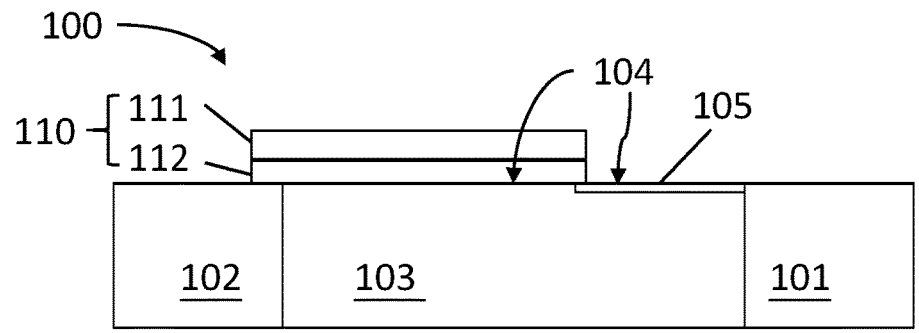
FIG. 1 illustrates a TFET according to one embodiment with gate-drain underlap.

The drawings are only schematic and are non-limiting. In the drawings, the size of some of the elements may be exaggerated and not drawn to scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn to scale for illustrative purposes. The dimensions and the relative dimensions do not correspond to actual reductions to practice of the disclosure.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

Where in embodiments reference is made to a "gate" or "gate stack", reference is made to a structure comprising a gate dielectric, which usually comprises a layer, in contact with the channel region of the device and sandwiched in between the channel region and a gate electrode, providing electric isolation there between. The gate dielectric may be referred to as dielectric layer or isolation layer.

According to an embodiment, the gate stack may overlap the region containing the source (source region), hence the source region extends beneath the gate stack. An "overlap", in the context of these embodiments (gate overlapping source), may be defined as the length of the source region which is covered by the gate. The overlap may be 0 nm (so there is no overlap, i.e. the gate is not covering the source region). This is also often referred to the term 'critically aligned', so the gate is critically aligned to the source region, i.e. the gate is aligned to the source-channel interface. The overlap may be larger than 0 nm.

In some embodiments the gate may underlap the drain region. An "underlap", in the context of the present disclosure, means that there is no overlap and that in these embodiments (a gate underlapping a drain) the drain region does not extend beneath the gate stack. An underlap may be defined as the length of the channel region towards the drain region (i.e. towards the channel-drain interface) which is not covered by the gate. The underlap may be 0 nm (so there is no underlap). This is also often referred to the term 'critically aligned', so the gate is critically aligned to the drain region, i.e. aligned with the channel-drain interface. The underlap may be larger than 0 nm.

The term 'underlap' and 'overlap' may be equally used for other regions of the device according to the embodiments.

Where in embodiments reference is made to a "drain extension region", "extension region", or simply "extension" (all terms are intended to mean the same device part) reference is made to a thin non-intrinsic region in or on the channel region of a TFET, extending along a predetermined surface of the channel region, which is the same surface which is also in contact with the gate dielectric of the gate stack. Different configurations may be used, for example the extension may be extending in the channel region; it may be extending on top of the channel region, thereby avoiding contact with the gate electrode; it may be sandwiched between the channel and the gate, etc. In a gate all around concept, not only the gate but also the drain extension region may be provided around the channel region.

In some embodiments, the gate may overlap the extension; in other embodiments a border of the extension may be aligned with a border of the gate stack, hence the extension region may be critically aligned with the gate stack. The extension may be closer to the drain region than to the source region. The extension does not touch the source region, but preferably remains at a distance of 20 nm or more therefrom. In some embodiments, the extension may be in contact or in overlap with the drain region. It may comprise the same materials as the drain region or as the intrinsic region. It may comprise the same doping level as the drain region, or a higher doping level. The extension region may comprise a heterostructure, a metal, semi-metal, etc., which may be doped or not. The extension region is thin, preferably 1-2 nm, up to a maximum thickness of about 5 nm. In double-gate or gate-all-around devices, care should be taken that the extension regions do not completely fill the body of the device; some default channel material should remain.

Where in embodiments reference is made to an "intrinsic region", reference is made to a region of the TFET with low doping levels as compared to the source region or the drain region, for example doping levels below $1 \times 10^{18}$ at/cm$^3$, more preferably doping levels between $1 \times 10^{15}$ at/cm$^3$ to $1 \times 10^{17}$ at/cm$^3$. The intrinsic region may be an undoped region. Typically, only the channel region of a TFET comprises an intrinsic semiconductor material.

In a first aspect, a TFET is provided comprising a source-channel-drain structure comprising a source region doped with a dopant element of a first dopant type and a first doping concentration, a drain region doped with a dopant element having a second dopant type opposite compared to the first dopant type and a second doping concentration, and a channel region situated between the source region and the drain region and having an intrinsic doping concentration or a low doping concentration, the low doping concentration being lower, e.g. at least a factor 10 lower, than the doping concentration of the source and drain regions. The TFET furthermore comprises a gate stack comprising a gate electrode layer and an isolation or gate dielectric layer. The gate stack covers at least part of the channel region and extends at the source side up to at least an interface between the source region and the channel region. The source-channel-drain structure has an outer surface or surface. The gate stack is contacting the source-channel-drain structure at the surface.

For example, the TFET may comprise a source-channel-drain structure, the source region and drain region being doped with dopants of opposite type, separated by the intrinsic material of the channel region. The channel-to-drain doping profile is conventionally a transition from intrinsic to n-doped (n-TFET) or p-doped (p-TFET), whereby the transition is either gradual or abrupt (box profile), and whereby the doping of the drain is intermediate (about $10^{18}$ at/cm$^3$) or high ($10^{20}$ at/cm$^3$ or more).

The TFET according to the embodiments further comprises a particular profile including a thin layer in the channel region, also called a drain extension region, which allows in the OFF state provision of a charged layer at that location, with a charge opposite to the charge of the majority carriers in the drain region. The extension region may, for example, comprise a high doping profile, or a heterostructure with a suitable band structure, or a semi-metal, or a metal with a suitable work function. The thickness of the extension region is small enough to avoid tunneling of carriers exclusively in the extension region. The length and position of the extension in the channel surface with respect to the gate and drain results in a reduction of band bending through the channel and drain region, increasing the electric field and hence band bending in the gate dielectric. In turn, this results in a decreased tunneling current from drain towards the gate (because tunneling takes place in the drain-channel region) and a delay of onset of drain tunneling.

In a TFET according to the embodiments, the extension region is placed such that in the OFF state the tunneling phenomena is suppressed or, if it occurs, the tunneling phenomenon takes place at least partially in a region with opposite charge with respect to the charge of the carriers in the drain region. This region with opposite charge provides the build-up of a larger-than-conventional electric field near the gate stack, such that the total potential difference between drain and gate results in a larger portion of the total electrostatic potential drop on the gate stack than in conventional designs in the OFF state. Thus, the extension region is provided in the channel region while having a surface that is at least partially in contact with, or in overlap with, the gate stack. The extension region is in proximity of the drain region extending towards, but not in contact with, the source region. For example, in embodiments in which there is a portion of the channel region which is not covered by the gate stack, the extension region may extend into the uncovered portion such that the surface of the extension region coincides with the surface of part of this portion of the channel region between the drain region and the gate stack, even with the surface of the extension region coinciding with the surface of the gate stack, and extending towards the source region up to a maximum distance beyond which the ON-current starts degrading. The extension region may be in underlap, or in contact with the drain region, or it may be overlapping it.

The electric field may advantageously present lower values in the bulk as compared to prior art devices without such extension region, because a large charge is present near the gate dielectric layer (e.g. an oxide layer) of the gate stack. The electrostatic potential drop across the gate dielectric layer may be advantageously larger as compared to prior art devices, and the electric field across the gate dielectric layer may thus be enhanced.

The effect of the extension region in the band structure of the TFET is a reduction of the curvature of the band in the drain and channel region. This has the effect of a sharper change of the band in the interface with the dielectric layer of the gate stack, increasing potential drop in the dielectric. Three main constraints affect the extension region. Firstly, it must be close to or inside the zone in which tunneling phenomena take place. The positioning of the extension region should take into account the contact with the gate stack, the length of the extension region and the minimum distance between its borders and the drain region. Secondly, the extension region should not affect the curvature of the band so much that tunneling phenomena take place entirely inside the extension region itself. This implies that the total bending inside the extension region should not surpass the gap energy Eg of the channel and drain region material. Using very thin layers for the drain extension region allows avoiding tunneling entirely inside the extension region, although the maximum thickness is also influenced by the type of materials forming the extension region. Taking the first and second constraints into account, the length of the extension region, which is the dimension along the surface of the source-channel-drain structure, falls typically between the 5 and 20 nm, for instance between 5 and 10 nm, with a thickness, which is the dimension perpendicular to the length of the extension region, of 5 nm or less, for instance 2 nm or less. The aspect ratio may be at least 2:1, or 3:1, 10:1, or more. Thirdly, the conduction band of the drain extension region should at least roughly align with that of the drain region. For example, a highly doped region may form the extension region. If a heterostructure, such as semiconductors, semi-metals or metals, forms the extension, the materials must be chosen so the band structure is suitable.

The present disclosure shall be described with reference to exemplary embodiments and drawings, but these are not intended to limit the present disclosure in any way.

FIG. 1 shows a TFET 100 comprising a longitudinal gated source-channel-drain structure of semiconductor material such as for instance silicon. The source-channel-drain structure comprises a drain region 101, a source region 102, and in between these a channel region 103. The source region 102 and the drain region 101 are doped with suitable dopants of opposite type. For instance, the drain region may be doped with n-type dopants while the source region is doped with p-type dopants (nTFET) or the drain region may be doped with p-type dopants while the source region is doped with n-type dopants (pTFET). Other materials than silicon (e.g. III-V materials) and suitable dopants may also be used. The drain region 101 is separated from the source region 102 by a channel region 103. The channel region 103 is made of intrinsic semiconductor material, or of lowly doped semiconductor material, e.g. having a doping concentration of $10^{17}$ at/cm$^3$ or below. The doping concentration of the channel region 103 is lower than the doping concentration of the drain region 101 and of the source region 102, for instance, at least a factor 10 lower. The channel region 103 contacts a gate stack 110 over part of its surface, for instance over part of its upper surface 104. The gate stack 110 includes an electrode layer 111 and an isolation or dielectric layer 112. The drain doping profile of the drain region 101 is shown in FIG. 1 as a box profile, but there are other possibilities such as an implanted or diffused profile, as illustrated in and explained in more detail with respect to FIG. 5. In case of box profile, as shown in FIG. 1, the interface between the intrinsic material of the channel region 103 and the doped drain region 101 is often orthogonal to the gate electrode 111-gate dielectric 112 interface. In addition to this conventional drain profile, embodiments include a drain extension region 105 which surface coincides with the same surface, e.g. upper surface 104, of the channel region 103 which is in contact with the gate stack 110. The drain extension region 105 is a thin top-layer, rather parallel to the gate electrode 111-gate dielectric 112 interface. The extension region 105 may be doped with a doping level higher than $10^{18}$ at/cm$^3$, for example higher than $5 \times 10^{18}$ at/cm$^3$, for example between $10^{19}$ and $5 \times 10^{20}$ at/cm$^3$. This highly doped region may have a thickness smaller than 5 nm. For example, it may have a thickness between 1 and 2 nm. It is positioned so that in the OFF state the tunneling phenomenon is suppressed or if it occurs, the tunneling phenomenon takes place at least partially in a region with opposite charge with respect to the charge of the carriers in the drain region. This region with opposite charge provides the build-up of a larger-than-conventional electric field near the gate stack, such that the total potential difference between drain and gate results in a larger portion of the total electrostatic potential drop on the gate stack than in conventional designs in the OFF state. The extension region 105 may be in contact with the drain region 101 (which may advantageously lower the resistance in the ON-state and hence slightly enhance ON-currents) and may extend across the surface 104 of the channel region 103 towards the source region 102 whereby the distance between the extension region and source region remains at least 10 nm in length, for example at least 20 nm; for example it may extend from the drain region 101 up to a small extension underneath the gate stack 110, as illustrated in FIG. 1. The extension region 105 in FIG. 1 extends underneath the gate stack 110. The overlap may typically reach up to 5 nm, but may also be up to 10 nm. The embodiments are not limited to configurations where the drain extension region 105 and the gate stack 110 overlap, and in some embodiments the extension region 105 may be critically aligned with the gate stack 110, thus the extension region 105 ends where the region underneath the dielectric layer 112 starts. In some embodiments, the extension region 105 may extend up to a distance of 20 nm from the interface between the source region 102 and the channel region 103. The shape of the thin layer forming the drain extension region 105, in an embodiment, is preferentially uniform, but comparable shapes with rounded edges or slightly changing thickness (below 5 nm) may also be comprised in exemplary embodiments.

Figure 2:
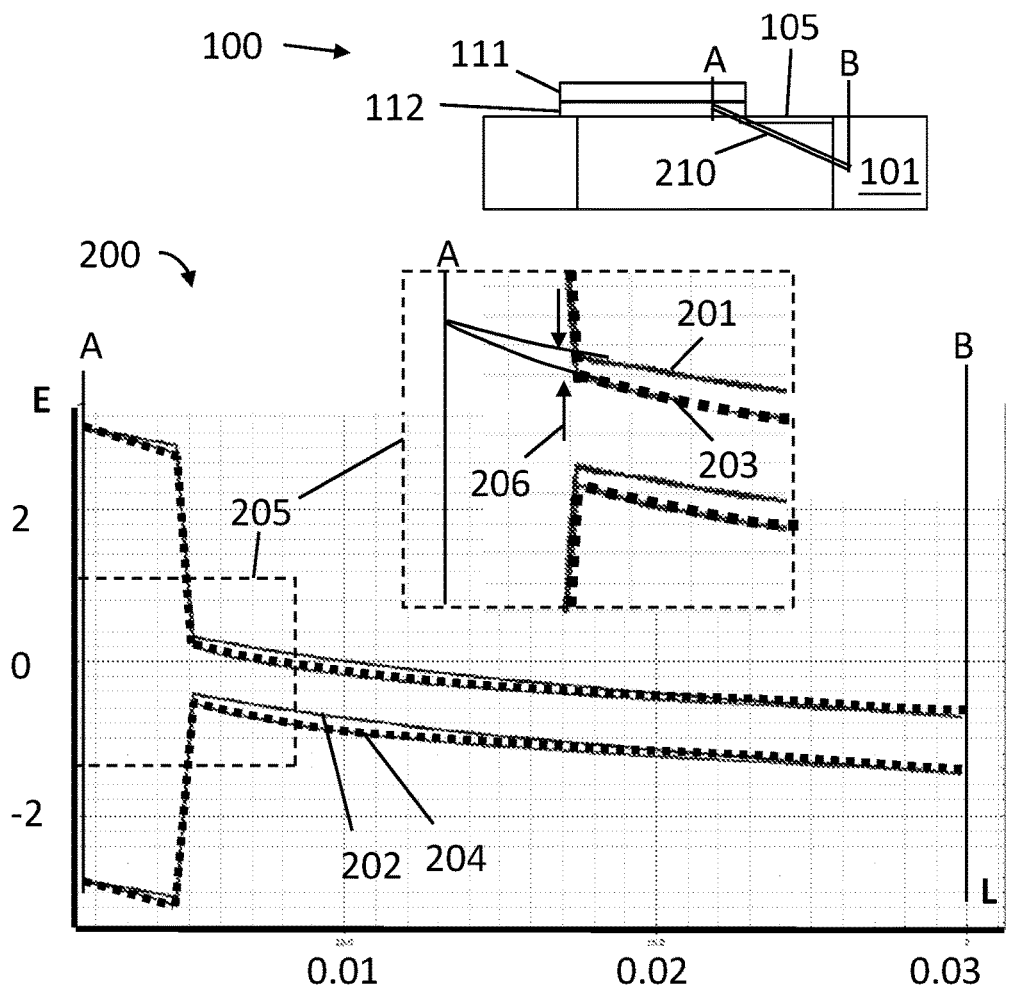
FIG. 2 illustrates the band diagram between the drain, channel, gate dielectric and gate electrode of a TFET according to one embodiment.

FIG. 2 shows the band diagram 200 of the TFET 100 with respect to the length L along the cutline 210 from the point A, in the interface between the gate electrode 111 and the dielectric layer 112, and the point B, in the drain region 101. The conduction band 203 and valence band 204 of an exemplary TFET 100 with drain extension region 105 in accordance with an embodiment present lower energy values in the bulk of the device than the reference conduction band 201 and valence band 202 of a prior art TFET. The potential drop is smaller in the channel region 103 and drain region 101, hence it is larger in the isolation layer 112. As shown in the zoomed region 205, the electrostatic potential drop across the dielectric layer 112 of the gate stack 110 is larger than the potential drop in devices without the extension 105. The band offset of the gate electric has been put to zero for illustrative purposes, so the extension of the lines 201 and 203 in the gate dielectric layer shows that the curves merge again at the gate electrode, which implies that the total voltage drop from drain to gate is in both cases the same. Hence, at the gate electrode 111 (in the point A), the voltage is the same for a TFET with and without extension 105 (the applied gate voltage), but the band 203 for the TFET 100 with extension region 105 has a lower energy value than the band 201 for a TFET without extension. This difference is shown by the arrows 206. Thus, the electric field is enhanced at the gate stack. The band-bending is reduced in the bulk of the device, hence an increased electrostatic potential drop is taken across the gate dielectric 112. Overall, because of this, the parasitic drain-towards-gate tunneling current is reduced (due to the smaller band bending in the channel/drain region and hence longer tunnel paths), because a large electrostatic potential drop is taken in the gate dielectric 112, which results in a much reduced electric field along the remainder of the tunnel path in the channel and drain region, whereby the total electrostatic potential drop from drain region 101 to gate electrode 111 remains substantially constant. Hence the onset of drain tunneling will be delayed. In addition to this decreased parasitic tunneling current, the doped thin extension region 105 allows for a higher ON-current because of the presence of additional carriers in the ON-state.

The extension 105 of FIG. 1 may be a highly doped layer at the surface 104 of the channel region 103 and/or the drain region 101, but the embodiments are not limited to such kind of extension region 105. For example, the extension region 105 may comprise a heterogeneous material. The thickness and length requirements on the extension region 105 in such cases may be the same or similar as in case of a doping layer. The extension region 105 may be formed by a 2D doped semiconductor (e.g. transition metal dichalcogenides) or semi-metal as graphene, which has the advantage of greater control over thickness of the layer. The heterogeneous layer may be doped or not, as long as the effect on the energy bands is present, namely providing in the OFF state a charged layer of charges of which the sign is opposite to the sign of the charge of the majority carriers in the drain region. For an n-TFET, the heteromaterial extension band alignment should be such that the conduction band roughly aligns with the conduction band of the channel/drain material, while the valence band should be the same as or below of the valence band of the channel/drain material. For example, the extension region 105 may comprise InP and the drain 101 may comprise InGaAs. For a p-TFET, the alignment with the valence band should be similar, while the conduction band of the extension region 105 should be at or above the conduction band of the channel/drain region.

The extension region 105 could also be a conductor, such as a suitable metal or a semi-metal layer. In semiconductors, a degenerated semiconductor behaves like a metal, thus a deposited metal layer may be considered as behaving analogously to a highly doped layer. In this embodiment, there is no need of implantation of dopants in the extension region 105. The maximum thickness of a metal extension region may be smaller than in the case of a highly doped extension region. The metal may comprise a monolayer, or a 1 or 2 nm-thick metal layer. The length of this thin extension region 105 may be about 20 nm, at least 10 nm, and maximally may cover the channel up to a minimum distance to the source, below which the ON-current starts deteriorating. The choice of materials and thickness of the extension region depends on the band structure of the material used for the TFET. A suitable metal may present a work function such that it aligns with the conduction band of the doped drain material, or is at a higher energy than the conduction band of the doped drain material. For example, a suitable metal may be aluminum for a typical TFET, but other materials (e.g. semi-metals such as undoped graphene) may be used.

The embodiments may be easily implemented in any type of TFET. For example, it may be implemented in n-type or p-type TFETs, or in p-n-i-n TFETs as well as bulk, single-gate or double-gate or gate-all-around TFETs. It may be applied to TFETs with heterogeneous structure in the source or channel, normally used to improve ON-current characteristics and SS value. For example, it may be applied to a hetero-TFET, a FinFET or trigate configuration, a nanowire FET, or any other suitable configuration.

Figure 3:
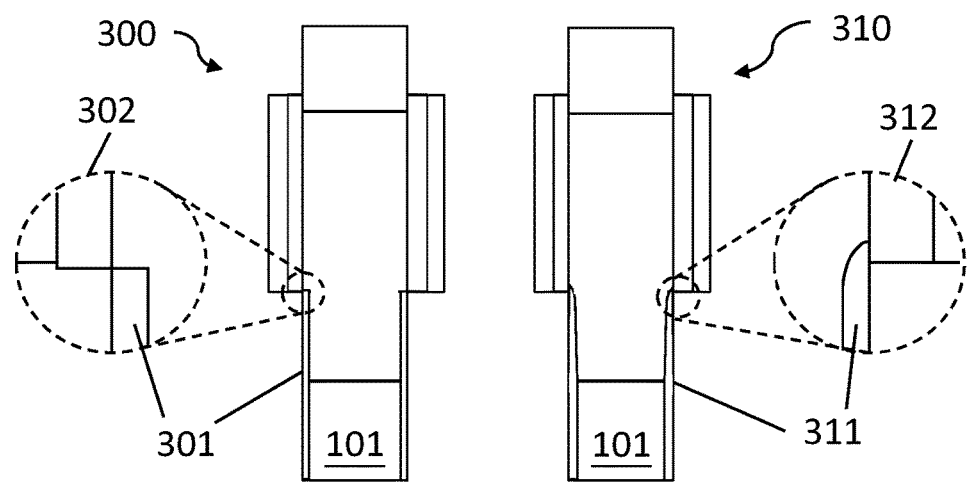
FIG. 3 illustrates two possible extension region profiles in vertical TFETs according to an embodiment.

For example, in the embodiment shown in FIG. 3, an extension region is implemented reaching up to those surfaces of the channel region which comprise a gate stack in a vertical TFET. The left-hand drawing 300 shows an extension region 301 with a box profile, critically aligned with the gate stack, as shown in the zoomed area 302. The right-hand drawing 310 shows an extension region 311 with non-box profile, and slightly overlapping the gate stack, as shown in the zoomed area 312. The extension region may either be applied in the ungated channel region, underlapping or in contact with the drain region; or, as shown in the examples 300, 310 of FIG. 3, it may also be added along the full ungated-channel region and drain region, completely overlapping the drain region 101. For example, the extension region 311 may be a doped region with the same type of dopant as the drain region 101, and it may have a higher doping concentration than the drain region 101. As an example, the doping may be a gradual doping whereby the doping decreases towards the center of the channel, away from the gate electrode—gate dielectric interface; building the doping across a maximum distance of 5 nm, for example. Other possibilities are envisaged, and this embodiment is compatible with a heterogeneous layer or even a metal layer, as previously discussed.

Figure 4:
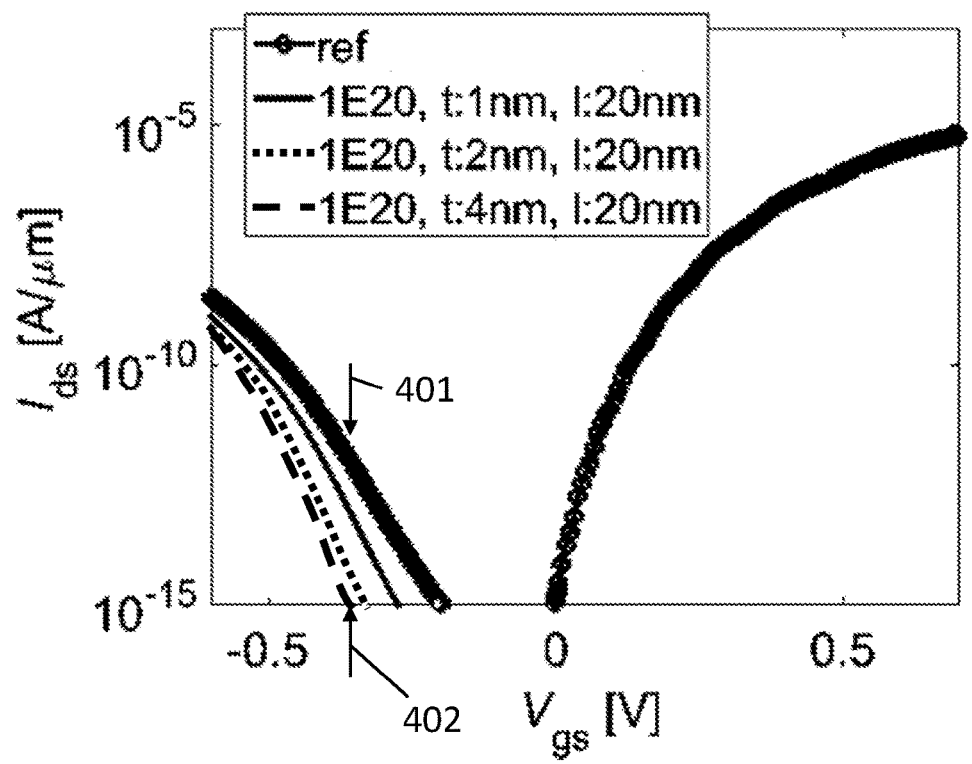
FIG. 4 shows the improvement of ambipolar current with thickness of an extension region according to an embodiment.

FIG. 4 illustrates a simulation of the current vs. gate voltages for a n-TFET with a 100 nm channel, $5\times10^{19}$ at/cm$^3$ doping of the drain region, $5\times10^{19}$ at/cm$^3$ doping of the source region, with an extension region of 20 nm of length, a doping level of $10^{20}$ at/cm$^3$, an equivalent oxide thickness of 1 nm, and extension regions with thicknesses of 1, 2 and 4 nm, respectively, for different values of gate-source voltage ($V_{GS}$). The dashed line corresponds to the drain extension region with 4 nm thickness. The dotted line corresponds to a thickness of 2 nm for the drain extension region and the continuous thin line corresponds to a 1 nm thick drain extension region. The circled lines labelled as "ref" are the values for a similar TFET but without extension region, as in the prior art. The arrows 401, 402 show that there may be a reduction of around 2 orders of magnitude in the OFF-current (more specifically, in the ambipolar current), while the ON-current does not change, and even improves for high values of $V_{GS}$ (not shown in the graph), due to a reduction in series resistance. This effect may be enabled by a higher carrier concentration stemming from the presence of the drain extension region in accordance with the embodiments.

It is to be noted that, despite the decreasing trend with increasing thickness of the extension region, for thicknesses over 5 nm, the ambipolar current returns to values similar or equal to the reference values that the TFET would have with no extension region. This effect occurs because a too thick extension region resembles a conventional drain region of which the interface with the channel region has now shifted to the interface of the extension region with the channel region closest to the source region.

Other configurations may be used with suitable adaptations. For example, a nanowire TFET may present a gate wrapping a part of the channel wall, and a single extension may be implemented next to the gate, e.g. partially extending underneath the gate, whereby the extension surface coincides with the surface of the channel wall, encircling it completely.

Figure 5:
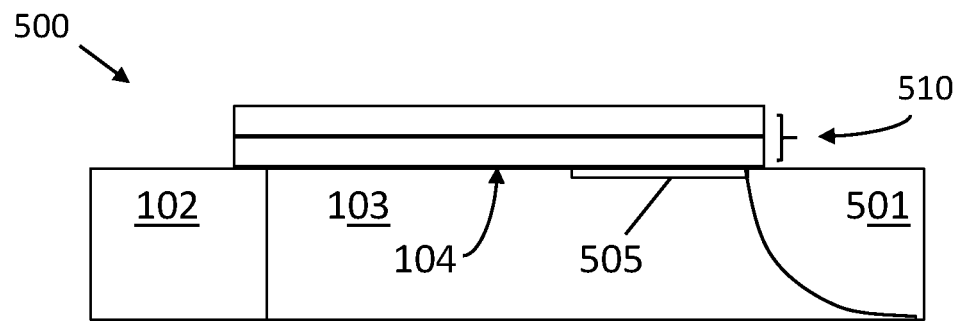
FIG. 5 shows an embodiment comprising a full gate transistor.
Figure 6:
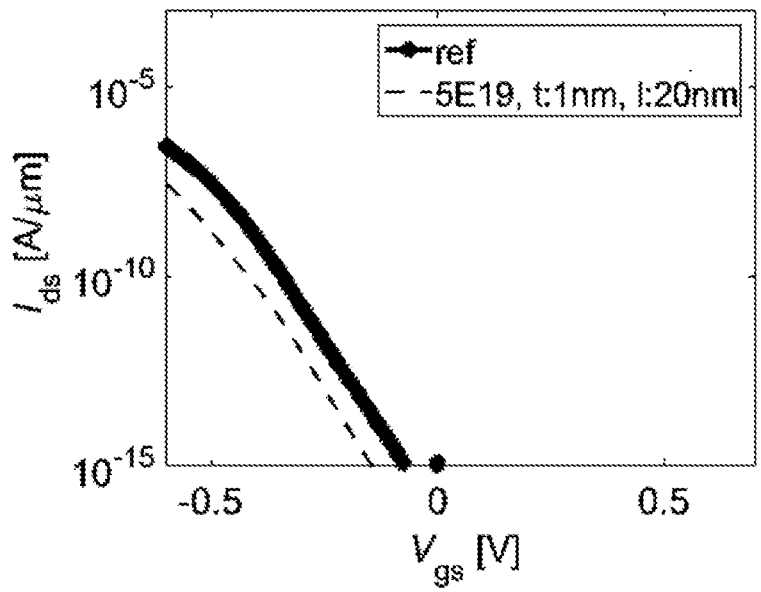
FIG. 6 shows improvement of the ambipolar current for the full gate transistor configuration.

Other embodiments may comprise a drain extension region 505 in a full-gate TFET design 500, as shown in FIG. 5, comprising a diffused drain region 501, with diffused profile, separated from the source region 102 by a channel region 103 contacting a gate stack 510, which covers the whole length of a surface 104 of the channel region 103, hence the name "full-gate TFET". In this embodiment, the extension region 505 is completely extending underneath the gate stack 510. The extension region 505 may be a heterogeneous layer, metal layer or a doped layer according to the geometrical, material and band constraints already discussed, and it may have a length of at least 10 nm, for instance about 20 nm, and maximally may cover the channel region 103 up to a distance from the source region 102 enough to avoid deterioration of the ON current (which, for the typical TFET configuration, is usually about 20 nm). Analogously to the case of gate stack—drain region underlap of FIG. 1, OFF-current/ambipolar current is reduced. This is shown in the simulation in FIG. 6. The ambipolar currents of a TFET without extension region ("ref" continuous line) and of a TFET with a drain extension region of 1 nm thickness, 20 nm length, and a doping level of $5 \times 10^{19}$ at/cm$^3$ in accordance with an embodiment (dashed line) are shown. It may be seen that the ambipolar current $I_{ds}$ is reduced 1 order of magnitude in the TFET according to an embodiment with respect to the prior art. In this configuration, the ON-current, not shown, is not affected by the presence of the drain extension region. Strong ON-current enhancement is not expected, unlike in the case of underlapping gate-drain.

Figure 7:
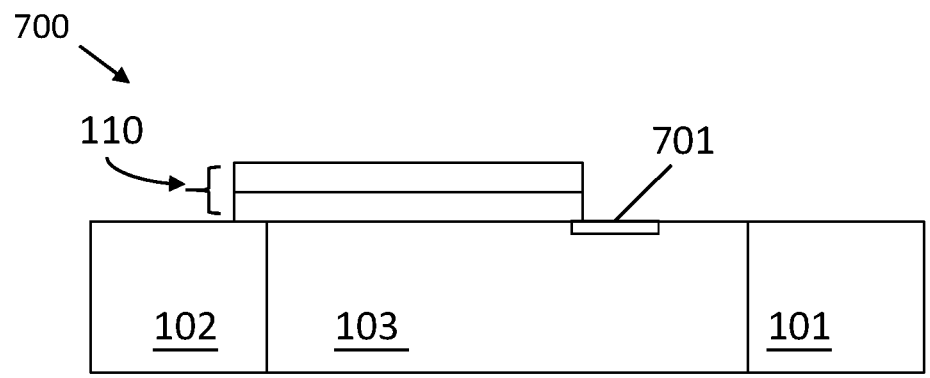
FIG. 7 shows an extension region with no overlap or contact with the drain in a TFET according to an embodiment.

Most of the examples already given show extension regions in contact with or overlapping the drain region, but also drain extension region—drain region underlap is an acceptable configuration, as shown in the TFET 700 of FIG. 7. The position of the extension region 701 and its length should be such that tunneling phenomena in the OFF state are suppressed or if they occur, the tunneling phenomena take place at least partially through a charged layer formed in the drain extension region 701 in the OFF state. For example, the position may be critically aligned with the border between the gate stack and the channel region, or an overlap may exist between the gate stack 110 and the drain extension region 701, as shown in FIG. 7. For example, the overlap may be 1 nm or 2 nm, or 5 nm, or 10 nm, or even more, as long as the proximity with the source region 102 does not affect the ON-current, for obtaining results comparable to the previous examples. The length of the drain extension region 701 may be at least 5 nm, for example 10 or 20 nm (limited by source region proximity, as explained). The extension region thickness constrains are the same or similar as in previous examples.

Combinations of the above features are within the margins of the embodiments. For example, it may be possible to implement the extension region 701 shown in FIG. 7 in a full-gate TFET as shown in FIG. 5, this is, an extension region completely overlapped by a full gate, but with no contact with the drain region (thus with underlap with respect to the drain region) in a full-gate TFET design. The constraints of the layer still hold in this case, so the extension region has to partially overlap with the tunnel paths responsible for the dominant portion of the 'first' observable and undesirable off-current in a TFET device which does not have the drain extension region, whereby 'first' refers to 'occurring at the least negative Vgs' in an n-TFET (occurring at the least positive Vgs in a p-TFET), which means that the length and position of the layer must be well defined. For example, the center of the layer may be situated at roughly 10 to 20 nm from the drain region, and the extension region may itself have a length of at least 5 nm, or at least 10 nm, or at least 20 nm, or even more. In this case, the extension region will have an impact on the first observable and undesirable OFF-current and the corresponding dominant tunnel paths. A distance between the center of the extension region and the drain region superior to 20 nm, however, may never occur, because it would not partially overlap with the dominant tunnel paths.

Figure 8:
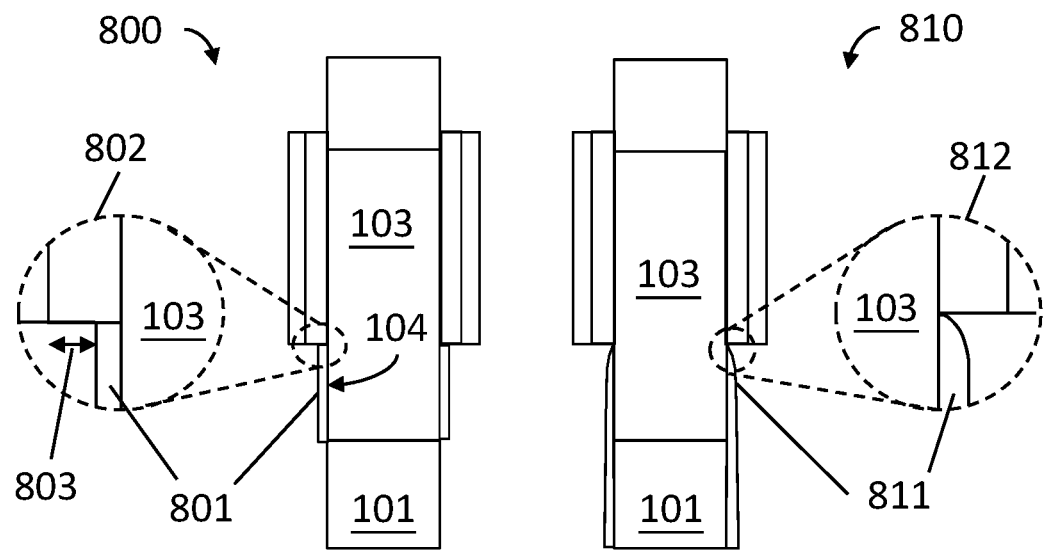
FIG. 8 illustrates an embodiment where the drain extension region is provided on top of the channel region.

The extension layer may be deposited, coated or otherwise provided on top of the channel, as shown in FIG. 8. This implementation may be advantageous in case of TFTs produced by hetero-growth or metal deposition. The left hand drawing 800 shows an extension region 801 with a box profile, which in the zoomed area 802 is shown as reaching (in contact with) the gate dielectric. In this case, the extension layer 801 is in contact with, but does not extend over the drain 101, but this is not intended to be limiting for the present disclosure, and the layer is provided on top of the surface 104 of the channel 103 rather than in the surface. In order to avoid shorts between the extension layer 801 and the gate electrode, a suitable distance 803 should be left there between. Likewise, the right hand drawing 810 shows an extension region 811 with a non-box profile, which in the zoomed area 812 is also shown as reaching (in contact with) the gate dielectric. In this case, the extension layer 811 extends over the whole drain 101, but this is not intended to be limiting for the present disclosure, and the layer 811 is provided on top of the surface of the channel 103 rather than in the surface, for example by deposition, coating, etc.

Other features may be part of the embodiments, such as charged dielectric gates. For example, a thin layer of positive charges may be present in the gate dielectric of an n-TFET at or near the interface (with the semiconductor material of the channel or drain region, along a length corresponding to the length of the previously described extension regions (or negative charges in case of a p-TFET).

Figure 9:
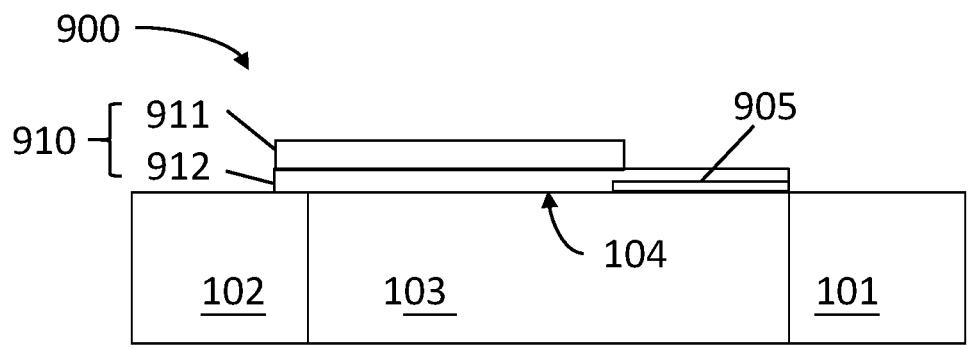
FIG. 9 illustrates an embodiment where the drain extension layer is formed by a charged gate dielectric.

An example of this structure, a TFET 900 is shown in FIG. 9, comprising, as before, a drain region 101, a source region 102, and in between these, a channel region 103. The gate stack 910 comprises a gate electrode 911 which underlaps the drain region 101. The position and configuration of the gate electrode 911 of FIG. 9 may correspond to the gate electrode 111 of FIG. 1, for example. The gate dielectric 912, however, covers the surface 104 of the channel 103 all the way to the drain 101, and possibly also covers at least part of the drain 101, along the zone which would correspond to the ungated surface in which the extension region 105 of FIG. 1 is placed. Along this zone (corresponding to the extension region 105 of FIG. 1), the gate dielectric comprises a charged layer 905, with more positive charge (for an n-TFET) than the rest of the gate dielectric which covers the remainder of the channel 103 and, possibly, the drain region 101. This charged layer would correspond by analogy to the extension layer 801 on top of the channel 103 of FIG. 8. The charges shall preferable be fixed or at least be present in the OFF-state. The advantage of lower series resistance in the ON-state will likely not be present in this case, but the presence of the charged layer according to an embodiment still results in a favorable band bending during OFF-state.

A method of fabrication of a TFET according to an embodiment comprises growing an n-i-p stack (for example by vertical growth), followed by gate stack deposition. In order to obtain the extension region, the ungated channel region is either implanted or diffused with e.g. doped spin-of-glass, or diffusion from a metal may be performed, or other means of delta-doping may be applied to create a very thin, ultra-high doping extension region. The drain extension region may also be implanted or diffused directly on the n-i-p stack, before gate stack deposition.

The process of fabrication may be compatible with CMOS processing.

What is claimed is:

1. A tunnel field-effect transistor, comprising:
   a source-channel-drain structure, the source-channel-drain structure comprising:
      a source region doped with a dopant element having a first dopant type and a first doping concentration,
      a drain region doped with a dopant element having a second dopant type opposite to the first dopant type, and a second doping concentration, and
      a channel region situated between the source region and the drain region and having an intrinsic doping concentration or a lowly doped concentration lower than the first doping concentration and the second doping concentration;
   a gate stack comprising a gate electrode on a gate dielectric layer, the gate stack covering at least part of the channel region and extending at the source side up to at least an interface between the source region and the channel region; and
   an extension region in or on top of the channel region and solely at the side of the drain region, the extension region comprising a layer with a doping level higher than $10^{18}$ at/cm$^3$, wherein a surface of the layer coincides with a surface of the channel region in contact with the gate stack, the extension region having a thickness less than 5 nm, the extension region extending up to a distance of at least 10 nm from the source region.

2. The tunnel field-effect transistor of claim 1, wherein the extension region extends 10 nm or less from an interface between the drain region and the channel region, and 20 nm or more from an interface between the source region and the channel region.

3. The tunnel field-effect transistor of claim 1, wherein a length of the extension region is 5 nm or more.

4. The tunnel field-effect transistor of claim 1, wherein a length of the extension region is at least the same as its thickness.

5. The tunnel field-effect transistor of claim 1, wherein a length of the extension region is at least twice as large as its thickness.

6. The tunnel field-effect transistor of claim 1, wherein the thickness of the extension region is 2 nm or less.

7. The tunnel field-effect transistor of claim 1, wherein the extension region is doped with dopant elements having the second dopant type.

8. The tunnel field-effect transistor of claim 7, wherein a doping concentration of the extension region is at least $10^{19}$ at/cm$^3$.

9. The tunnel field-effect transistor of claim 1, wherein the extension region comprises a metal layer.

10. The tunnel field-effect transistor of claim 1, wherein the extension region is in contact with an interface between the drain region and the channel region.

11. The tunnel field-effect transistor of claim 10, wherein the extension region partially or totally overlaps the drain region.

12. The tunnel field-effect transistor of claim 1, wherein the extension region at least partially extends underneath the gate stack.

13. The tunnel field-effect transistor of claim 1, wherein the gate stack is selected from the group consisting of a double-gate structure and a gate all around structure.

* * * * *